(12) United States Patent
Kawashima et al.

(10) Patent No.: US 8,641,232 B2
(45) Date of Patent: Feb. 4, 2014

(54) LIGHT EMITTING DEVICE AND ILLUMINATION APPARATUS

(75) Inventors: Seiko Kawashima, Yokosuka (JP);
Yuichiro Takahara, Yokosuka (JP);
Kazuya Kondo, Yokosuka (JP); Yusuke Shibahara, Yokosuka (JP); Hiroki Tamai, Yokosuka (JP); Haruki Takei, Yokosuka (JP); Tsuyoshi Oyaizu, Yokosuka (JP)

(73) Assignee: Toshiba Lighting & Technology Corporation, Kanagawa (JP)

( * ) Notice: Subject to any disclaimer, the term of this patent is extended or adjusted under 35 U.S.C. 154(b) by 180 days.

(21) Appl. No.: 13/162,668

(22) Filed: Jun. 17, 2011

(65) Prior Publication Data
US 2011/0310609 A1    Dec. 22, 2011

(30) Foreign Application Priority Data

Jun. 18, 2010   (JP) ................. 2010-139367

(51) Int. Cl.
*F21V 21/00*   (2006.01)
(52) U.S. Cl.
USPC .............. 362/249.01; 362/249.02; 362/646
(58) Field of Classification Search
USPC ............... 362/647, 652, 655–659, 362/249.01–249.02, 646
See application file for complete search history.

(56) References Cited

U.S. PATENT DOCUMENTS

| | | | |
|---|---|---|---|
| 7,728,231 B2 * | 6/2010 | Matsui et al. ............. | 174/252 |
| 7,906,731 B2 * | 3/2011 | Matsui et al. ............. | 174/252 |
| 2006/0141851 A1 | 6/2006 | Matsui | |
| 2009/0103296 A1 | 4/2009 | Harbers | |
| 2009/0290346 A1 | 11/2009 | Ogawa | |
| 2010/0025721 A1 | 2/2010 | Sakai | |

FOREIGN PATENT DOCUMENTS

| | | |
|---|---|---|
| CN | 201110514 | 9/2008 |
| CN | 101452977 | 6/2009 |
| CN | 101586753 | 11/2009 |
| JP | 2004-265626 | 9/2004 |
| JP | 3989794 | 10/2007 |
| JP | 2008-270106 | 11/2008 |
| WO | WO 2004/071143 | 8/2004 |

OTHER PUBLICATIONS

European Search Report issued in EP 11170187 on Sep. 5, 2012.
English Language Abstract of JP 3989794 published Oct. 10, 2007.
English Language Translation of JP 3989794 published Oct. 10, 2007.

(Continued)

*Primary Examiner* — Thomas Sember
(74) *Attorney, Agent, or Firm* — DLA Piper LLP (US)

(57) ABSTRACT

According to one embodiment, a light emitting device includes: a substrate a back face side of which is disposed on a mounting member; a plurality of light emitting elements mounted on a surface side of the substrate; and a power supply terminal provided on the surface side of the substrate and electrically connected to the light emitting elements. The power supply terminal is connected to electrical connecting units by elastic pressing force directed from the surface side of the substrate to the mounting member side. A mechanical fixing unit has a pressing portion brought into contact with the surface side of the substrate. The mechanical fixing units fix the substrate to the mounting member with use of elastic pressing force of the pressing portions directed from the surface side of the substrate to the mounting member side.

8 Claims, 12 Drawing Sheets

(56) References Cited

OTHER PUBLICATIONS

Chinese Office Action issued in CN 201110162141.X on Mar. 14, 2013.
English Language Translation of Chinese Office Action issued in on 201110162141.X on Mar. 14, 2013.
English Language Abstract of CN 201110514 published Sep. 3, 2008.
English Language Abstract of CN 101586753 published Nov. 25, 2009.
European Office Action issued in EP 11170187.6 on Sep. 3, 2013.
Chinese Office Action issued in CN 201110162141 issued on Oct. 8, 2013.
English Language Translation of Chinese Office Action issued in CN 201110162141 issued on Oct. 8, 2013.
English Language Abstract of CN 101452977 published on Jun. 10, 2009.
Japanese Office Action issued in JP 2010-139367 on Dec. 4, 2013.
English Langauge Translation of Japanese Office Action issued in JP 2010-139367 on Dec. 4, 2013.
English Languange Abstract & Translation of JP 2004-265626 published on Sep. 24, 2004.
English Language Abstract Translation of JP 2008-270106 published Nov. 6, 2008.

* cited by examiner

| LIGHT EMITTING DEVICE | (a) | (b) | (c) | (d) |
|---|---|---|---|---|
| DEFORMATION AMOUNT(μm) | 2 | 2 | 0.2 | 0.2 |
| LIGHT EMISSION EFFICIENCY(%) | 100 | 97 | 100 | 100 |

FIG. 11

LIGHT EMITTING DEVICE AND ILLUMINATION APPARATUS

INCORPORATION BY REFERENCE

The present invention claims priority under 35 U.S.C. §119 to Japanese Patent Application No. 2010-139367 filed on Jun. 18, 2010. The content of the application is incorporated herein by reference in their entirety.

FIELD

Embodiments described herein relates generally to a light emitting device using light emitting elements such as LEDs, and an illumination apparatus.

BACKGROUND

LEDs have been recently used as a light source of an illumination apparatus. The light source is constituted by a light emitting device in which many LED bare chips are mounted on a substrate and each LED chip is electrically connected by bonding wires. In such a light emitting device, generally, a power supply terminal electrically connected to the LEDs is soldered with a power supply connector and power is supplied to the LEDs.

On the other hand, highlight output is required for the light emitting device, and current to be supplied to the LEDs is required to be increased for realizing the high light output. However, when current to be supplied is increased, the temperature of each LED rises, and the LEDs operate at high temperature, therefore, there is a possibility that the temperature of the substrate rises accordingly, a difference between thermal expansion and contraction of the substrate becomes large at a heat cycle of lighting-on and lighting-off of the LEDs, stress is applied to a solder portion of the power supply connector, and cracks are caused and reliability is lowered.

Therefore, a so-called contact-pressure type power supply connector which connects to a power supply terminal is a method that does not require use of solder. In this case, it is conceivable that the power supply connector is electrically connected to the power supply terminal by a contact member for applying contact pressure, that is, elastic pressing force, and a substrate is kept fixed.

BRIEF DESCRIPTION OF THE DRAWINGS

FIG. 11 is a table indicating a result of a deformation amount of a power supply terminal.

DETAILED DESCRIPTION

Figure 1:
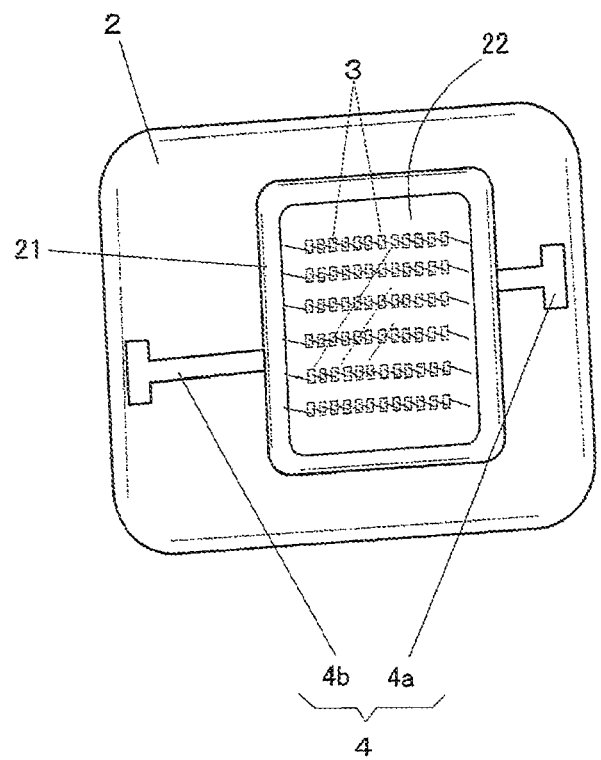
FIG. 1 is a perspective view showing a light emitting device according to a first embodiment.

A light emitting device of an embodiment includes: a substrate a back face side of which is disposed on a mounting member; a plurality of light emitting elements mounted on a surface side of the substrate; and a power supply terminal electrically connected to the light emitting elements provided on the surface side of the substrate. Electrical connecting units are connected to the power supply terminal by elastic pressing force directed from the surface side of the substrate to the mounting member side. Mechanical fixing units each having a pressing portion are brought into contact with the surface side of the substrate. The substrate is fixed to the mounting member by the mechanical fixing units with use of elastic pressing force of the pressing portions directed from the surface side of the substrate to the mounting member side.

A light emitting device according to a first embodiment will be described below with reference to FIGS. 1 to 7. Moreover, the same symbols are attached to the same portions in the figures and overlapping description thereof will be omitted.

As representatively shown in FIGS. 1 to 5, a light emitting device 1 includes: a substrate 2; a plurality of light emitting elements 3 mounted on a surface side of the substrate 2; a power supply terminal 4 similarly provided on the surface side of the substrate 2; electrical connecting units 5 electrically connected to the power supply terminal 4; and mechanical fixing units 6 for fixing the substrate 2.

The substrate 2 has insulativity, and is formed of ceramics such as white aluminum oxide or aluminum nitride. The substrate 2 is formed in an approximately square shape and each corner is formed in an R-shape.

Figure 2:
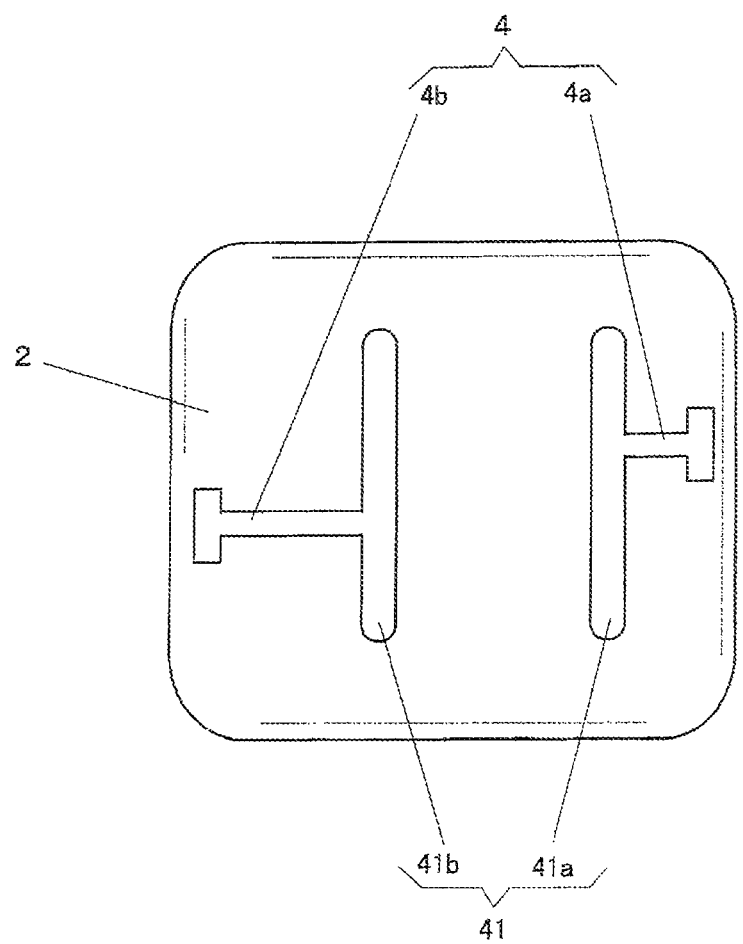
FIG. 2 is a plan view showing a pattern of a power supply terminal and a power supply conductor on a substrate of the light emitting device.

As shown in FIG. 2, a wiring pattern is formed on the surface of the substrate 2 and constituted by the power supply terminal 4 and a power supply conductor 41. The power supply terminal 4 is constituted by an anode side power supply terminal 4a and a cathode side power supply terminal 4b, and the power supply conductor 41 is constituted by an anode side power supply conductor 41a and a cathode side power supply conductor 41b.

As shown in FIG. 2, the anode side power supply conductor 41a and the cathode side power supply conductor 41b are formed, as a pair, vertically in parallel with each other at a predetermined interval. The anode side power supply terminal 4a and the cathode side power supply terminal 4b orthogonally extend outward, from middle portions of the anode side power supply conductor 41a and the cathode side power supply conductor 41b respectively, and the anode side power supply terminal 4a and the cathode side power supply terminal 4b of each side constitute an approximately T-shaped body. The anode side power supply terminal 4a and the cathode side power supply terminal 4b are arranged in a symmetrical position with respect to a point at 180°.

Figure 6:
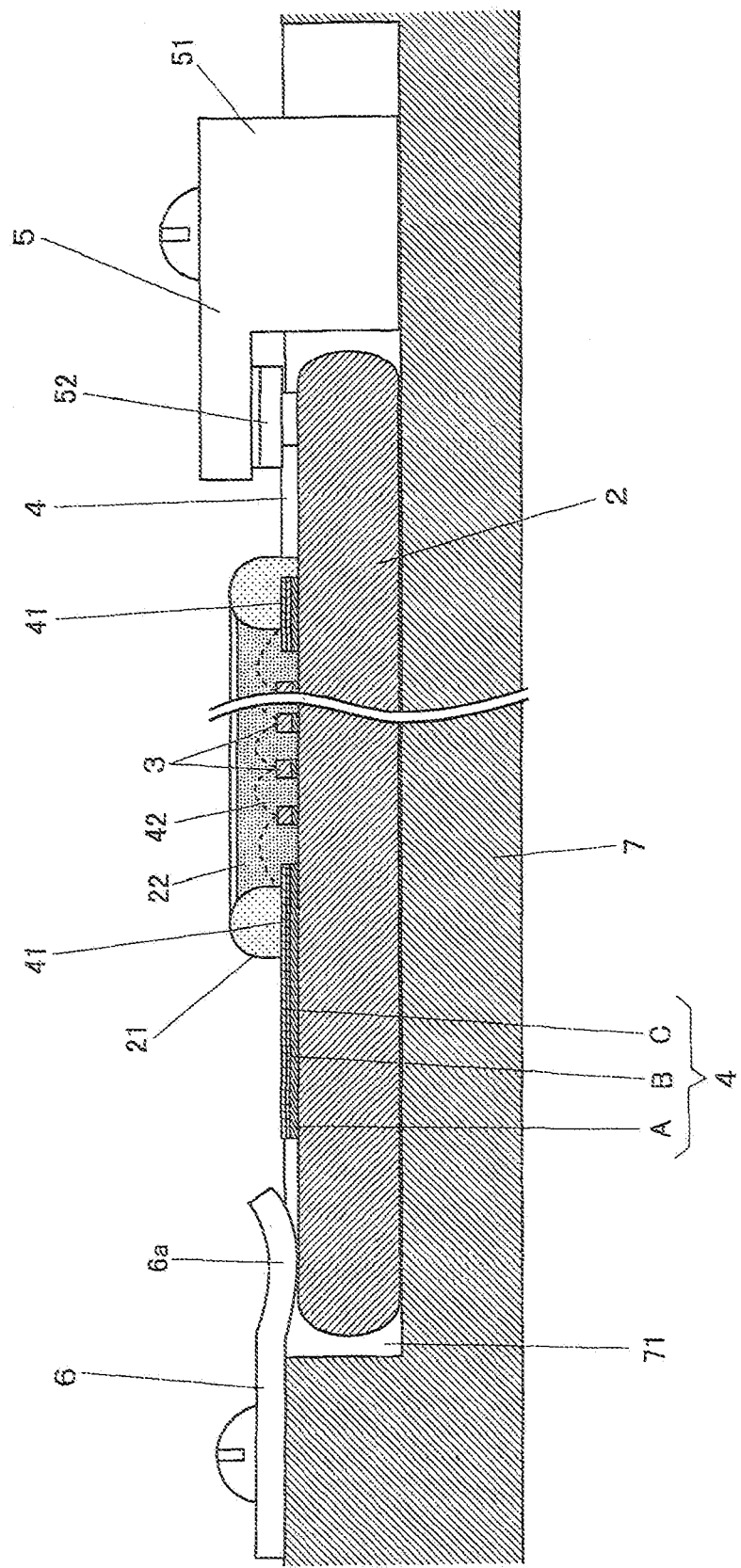
FIG. 6 is a cross sectional view taken along line X-X in FIG. 5.

As shown in FIG. 6, the power supply terminal 4 and the power supply conductor 41 are constituted by three layers, and a silver (Ag) layer as a first layer A is formed on the substrate 2 by screen printing. After the silver layer is baked, the first layer A is electroless-plated with nickel (Ni) as a second layer B, and the second layer B is electroless-plated with gold (Au) as a third layer C. The silver (Ag) layer, the nickel (Ni) layer and the gold (Au) layer are 10 µm, 2 µm and 0.5 µm in thickness respectively. Since gold (Au) is excellent in conductivity and has corrosion-resistance, it is effective that the gold layer is formed as a surface layer of the power supply terminal 4.

The plurality of light emitting elements 3 are mounted on the surface of the substrate 2. The light emitting element 3 is an LED bare chip. As the LED bare chip, for example, an LED bare chip emitting light of blue electroluminescence is used so as to make a light emitting portion emit light of white electroluminescence.

Figure 3:
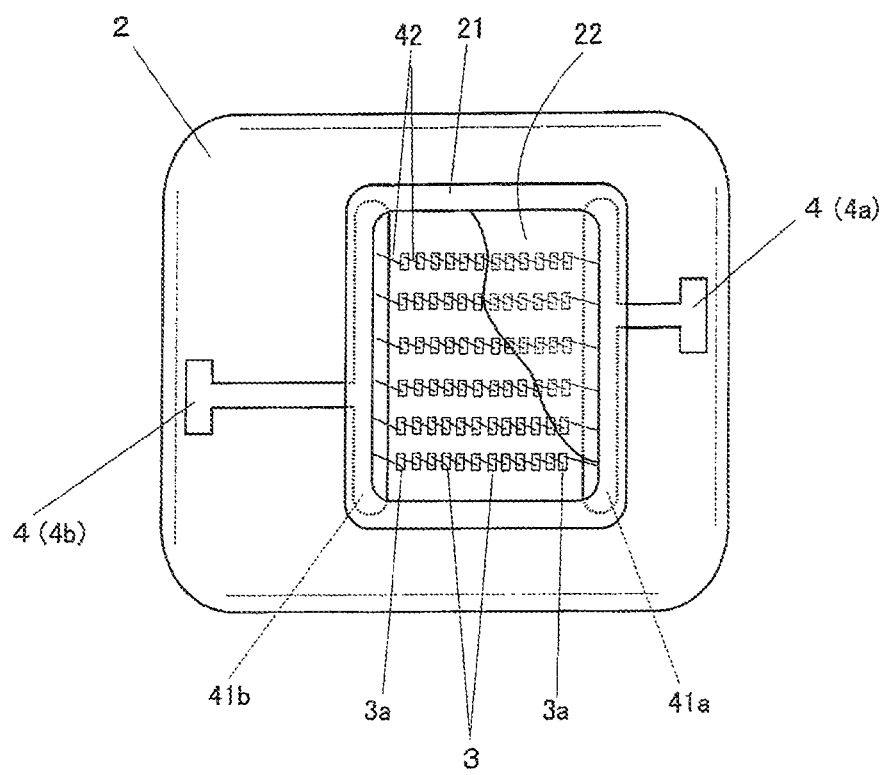
FIG. 3 is a plan view partially showing the light emitting device.

As shown in FIGS. 1 and 3, the plurality of light emitting elements 3 are arranged in a matrix shape, and formed in a plurality of, for example, six rows.

The LED bare chip is, for example, an InGaN-based element. A light emitting layer is laminated on a light-transmissive sapphire element substrate and formed in an approximately rectangular parallelepiped shape in which an n-type nitride semiconductor layer, an InGaN light emitting layer and a p-type nitride semiconductor layer are successively laminated. An electrode for supplying current to the light emitting layer is provided at an upper face side and constituted by a positive side electrode formed by a p-type electrode pad on the p-type nitride semiconductor layer and a negative side electrode formed by an n-type electrode pad on the n-type nitride semiconductor layer. These electrodes are electrically connected by a bonding wire 42. The bonding wire 42 is constituted by a gold thin wire (Au) and connected via a bump mainly composed of gold (Au) for improving mounting intensity and reducing damage of the bare chip.

Specifically, in each light emitting element row, the different electrodes of the light emitting elements 3 adjacent in an extending direction of the row, the positive side electrode of the light emitting element 3 and the negative side electrode of the adjacent light emitting element 3 are successively connected by the bonding wire 42. Thus, the plurality of light emitting elements 3 constituting each light emitting element row are electrically connected in series to each other. Accordingly, the plurality of light emitting elements 3 simultaneously emit light with the elements energized.

Additionally, in each light emitting element row, the electrodes of the specific light emitting elements, that is, the light emitting elements 3a arranged at both ends of the row, are connected to the anode side power supply conductor 41a and the cathode side power supply conductor 41b by the bonding wires 42. Accordingly, the light emitting element rows are provided electrically in parallel to each other and receive power from the power supply terminal 4 through the anode side power supply conductor 41a and the cathode side power supply conductor 41b. Thus, even when any one of the light emitting element rows cannot emit light due to poor bonding or the like, light emission of the whole light emitting device 1 is not stopped.

A frame member 21 is provided on the surface of the substrate 2. The frame member 21 is applied in an approximately rectangular shape, and each light emitting element 3 is disposed in a region surrounded by the inner peripheral face of the frame member 21. That is, a mounting region of the light emitting elements 3 is surrounded by the frame member 21.

On the substrate 2, the inside of the frame member 21 is filled with sealing member 22. The sealing member 22 is made of light-transmissive synthetic resin, for example, transparent silicon resin and seals the mounting region of the light emitting elements 3.

The sealing member 22 contains a proper amount of fluorescent matter. The fluorescent matter is excited by light emitted from the light emitting elements 3 and radiates light having a color different from the color of the light emitted from the light emitting elements 3. In the present embodiment, yellow fluorescent matter, which radiates yellow light having a complementary relationship with blue light emitted from the light emitting element 3, is used as the fluorescent matter so that white light can be emitted. A predetermined amount of the non-cured sealing member 22 is put inside the frame member 21, and then heated and cured.

Figure 4:
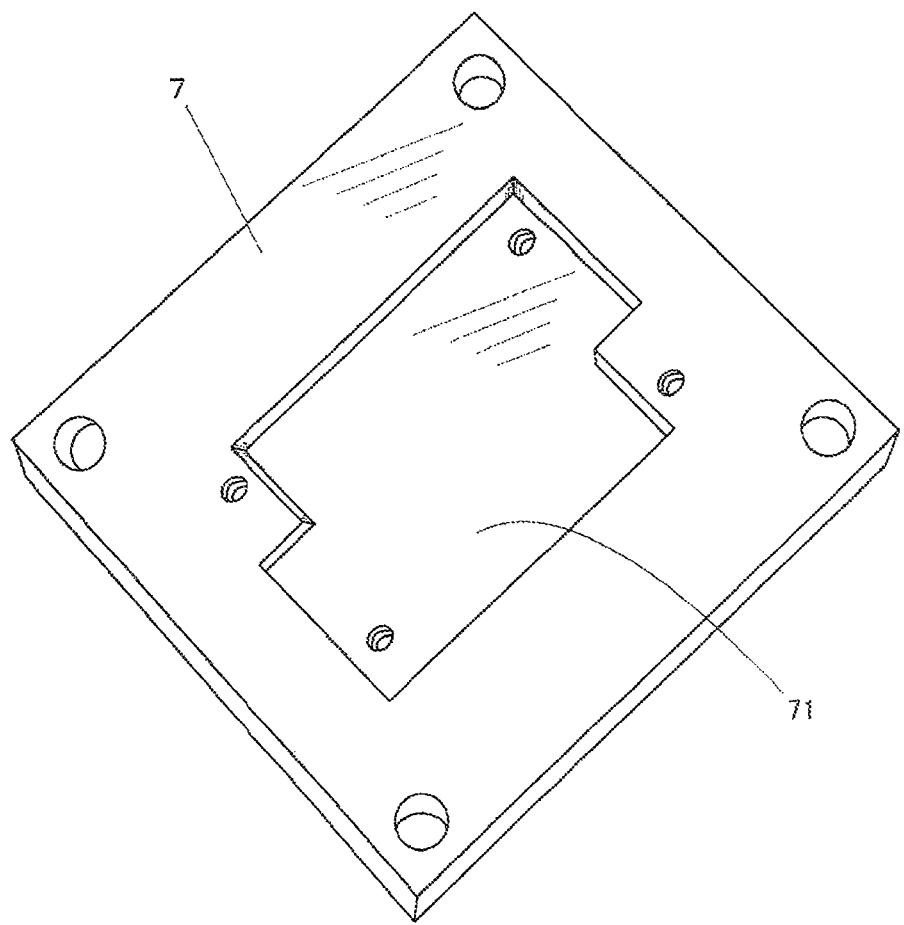
FIG. 4 is a perspective view showing a mounting member of the light emitting device.

The substrate 2 constituted as described above is mounted on a mounting member 7 shown in FIG. 4. The mounting member 7 is made of aluminum or the like excellent in thermal conductivity and formed in a rectangular shape, and a recess portion 71 on which the substrate 2 is mounted is formed at a center portion of the mounting member 7. At corners of the mounting member 7, screw through-holes are formed which are used for fixing the mounting member 7 to a body or the like of an illumination apparatus. Moreover, the mounting member 7 may be a member called a heat sink, device body, case or cover or the like. The point is that the mounting member 7 is a member on which the substrate 2 is mounted.

Figure 5:
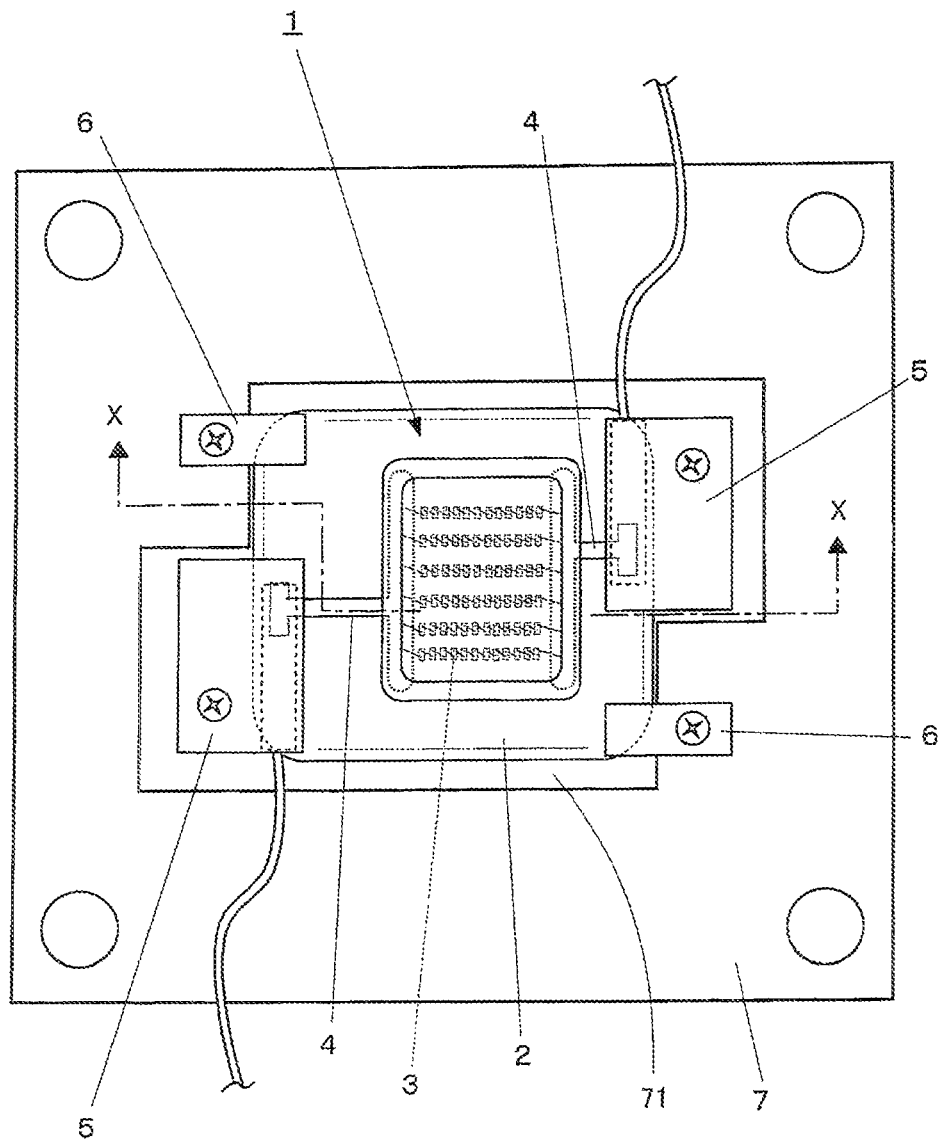
FIG. 5 is a plan view showing the light emitting device.

As shown in FIGS. 5 and 6, the substrate 2 is positioned and arranged by the recess portion 71 as a guide of the mounting member 7 and mounted so that the back face side is brought into close contact with a bottom face of the recess portion 71. That is, the substrate 2 is mounted in a manner that elastic pressing force directed from the surface side of the substrate 2 to the mounting member 7 side is applied to the substrate 2 by the electrical connecting units 5 and the mechanical fixing units 6.

Figure 7:
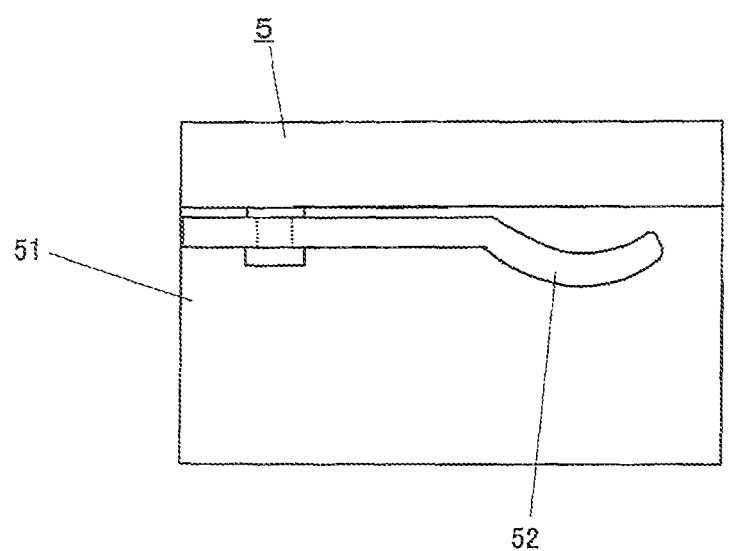
FIG. 7 is a front view showing an electrical connecting unit of the light emitting device.

As shown in FIG. 7, the electrical connecting unit 5 is a contact-pressure type power supply connector and electrically connected to the power supply terminal 4, and the pair of electrical connecting units 5 is disposed approximately on a diagonal line of the substrate 2. The electrical connecting unit (power supply connector) 5 includes a case 51 made of white synthetic resin slightly absorbing light and a contact member 52 disposed in the case 51 and having a curved contact portion at its top end. The contact member 52 has elasticity and is formed of phosphor bronze or Corson alloy, and a surface of the member 52 is plated with gold (Au). A surface layer, which comes into contact with the contact members 52, of the power supply terminal 4 is plated with gold (Au). Thus, corrosion due to bimetallic contact can be prevented.

The electrical connecting unit (power supply connector) 5 is fixed from the surface side of the substrate 2 to the recess portion 71 of the mounting member 7 by a fixing unit such as a screw. Thus, elastic pressing force, that is, contact pressure, which is directed from the surface side of the substrate 2 to the mounting member 7 side, of the contact member 52 is applied to the power supply terminal 4, and the contact member 52 is electrically connected to the power supply terminal 4.

The mechanical fixing unit 6 is a fixing member in an approximately rectangular shape and located on an upper face of the mounting member 7, and the pair of mechanical fixing units 6 is disposed approximately on the other diagonal line of the substrate 2. The mechanical fixing unit (fixing member) 6 has a curved pressing portion 6a at its top end, and is formed of elastic stainless steel and fixed from the surface side of the substrate 2 to the upper face of the mounting member 7 by a fixing unit such as a screw. With the mechanical fixing unit (fixing member) 6 fixed, the pressing portion 6a comes into contact with the surface of the substrate 2 at a position lower (substrate 2 side) than the upper face of the mounting member 7. Accordingly, stress applied to a fixation portion, at which the mechanical fixing unit (fixing member) 6 is fixed by the screw or the like, can be reduced.

Thus, the elastic pressing force, which is directed from the surface side of the substrate 2 to the mounting member 7 side, of the pressing portion 6a of the mechanical fixing unit (fixing member) 6 is applied to the substrate 2, and the substrate 2 is fixed to and held by the mounting member 7.

The electrical connecting unit 5 thus constituted mainly has a function of being electrically connected to the power supply terminal 4, and the mechanical fixing unit 6 thus constituted mainly has a function of fixing the substrate 2. Accordingly, although the elastic pressing force of the electrical connecting unit 5 contributes to the function of fixing the substrate 2, it is not required to be made extremely large because the mechanical fixing unit 6 is provided.

In this connection, it is appropriate to set the elastic pressing forces (elastic load) of the electrical connecting unit 5 and the elastic pressing forces (elastic load) of the mechanical fixing unit 6 to 70 to 200 g and 200 to 300 g respectively. Additionally, in this case, for effective realization of both the functions, the elastic pressing force of the electrical connecting unit 5 is preferably set smaller than the elastic pressing force of the mechanical fixing unit 6.

When power is supplied from a lighting circuit to the light emitting device 1 constituted as described above, current flows from one of the electrical connecting units 5 to the other through the anode side power supply terminal 4a, the anode side power supply conductor 41a, the bonding wire 42, the light emitting element 3, the cathode side power supply conductor 41b and the cathode side power supply terminal 4b in this order, the light emitting elements 3 covered with the sealing member 22 simultaneously emit light, and the light emitting device 1 is used as a planar light source emitting white light.

During lighting, heat generated from each light emitting element 3 is mainly conducted from the surface side of the substrate 2 to the mounting member 7 and radiated. Additionally, light, which is radiated from the light emitting elements 3 and advances to the substrate 2 during lighting of the light emitting device 1, is mainly reflected on the surface of the white substrate 2 in a light use direction.

Since the elastic pressing force of the electrical connecting unit 5 is not set extremely large, reduction in the elastic pressing force can be suppressed even if the light emitting device 1 is used for a long time under an environment of high temperature. Further, even when the light emitting device 1 is used for an illumination apparatus easily receiving vibration, reduction in the elastic pressing force can be similarly suppressed. In addition, wear caused to a contact portion between the power supply terminal 4 and the contact member 52 due to vibration or thermal expansion and contraction of the substrate 2 can be reduced.

Since the substrate 2 is not fixed to the mounting member 7 by a screw or the like but by the elastic pressing force of the mechanical fixing unit 6, for example, occurrence of a crack of the substrate 2 due to direct application of fastening force to the substrate 2 can be suppressed. Additionally, while the light emitting device 1 is used, stress by thermal expansion and contraction of the substrate 2 can be relieved and occurrence of a crack of the substrate 2 due to the thermal expansion and contraction can be suppressed.

According to the present embodiment as described above, since both the electrical connecting units 5 and the mechanical fixing units 6 are provided, a light emitting device capable of maintaining reliability of a contact function of the electrical connecting unit 5 can be provided.

Figure 8:
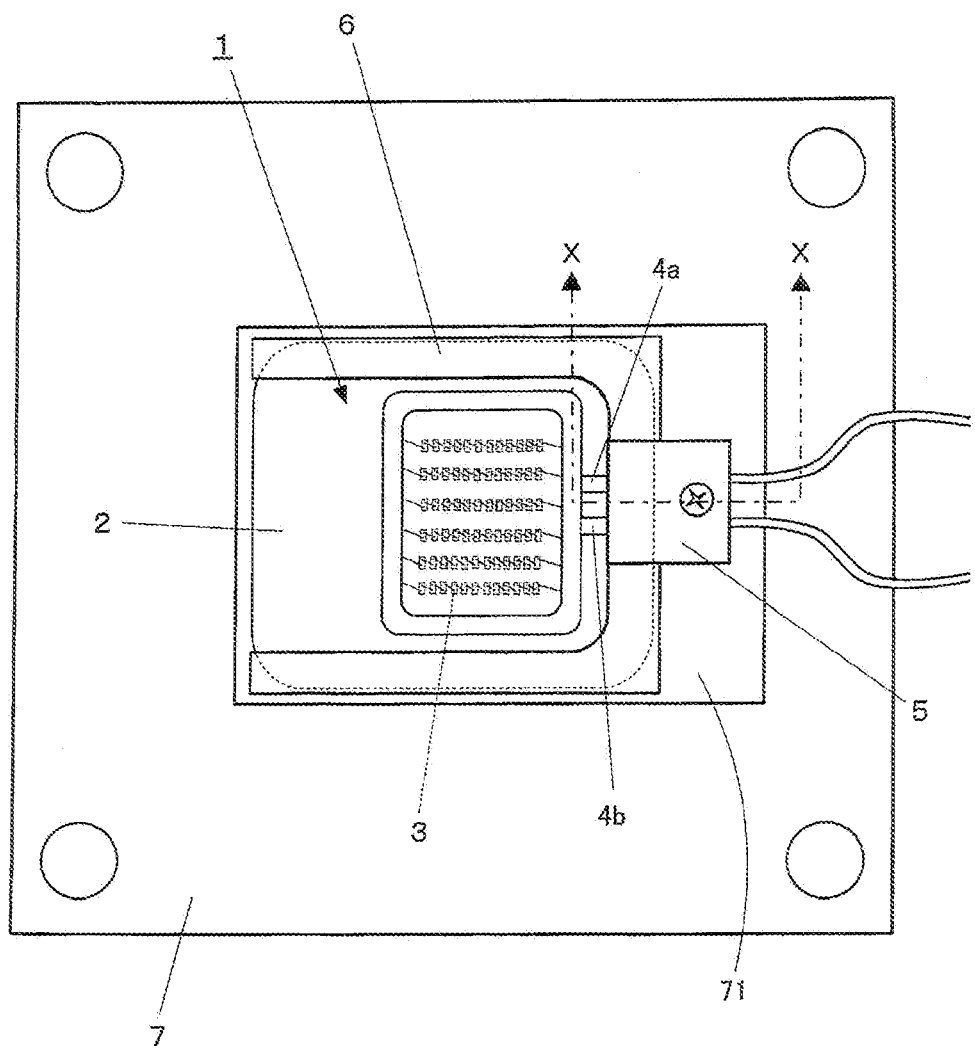
FIG. 8 is a plan view showing a light emitting device according to a second embodiment.
Figure 9:
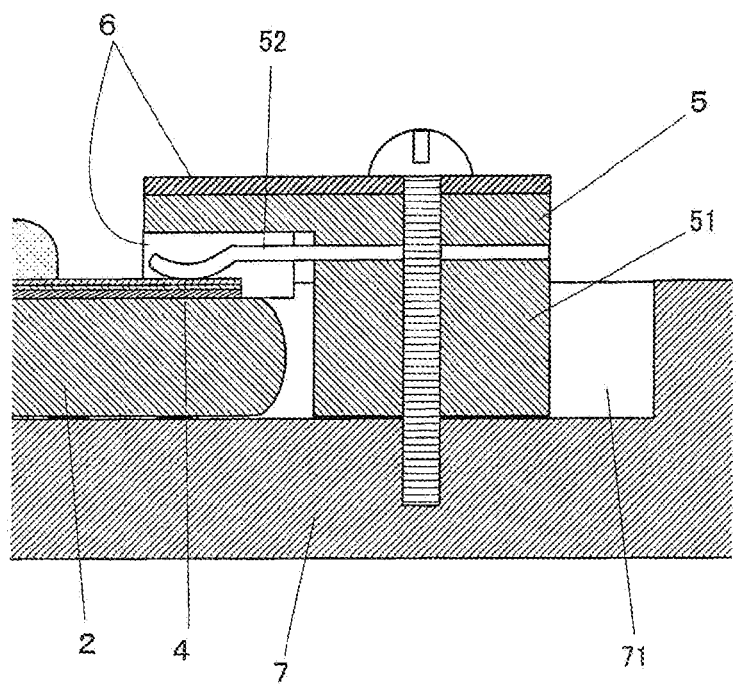
FIG. 9 is a cross sectional view taken along line X-X in FIG. 8.

Next, a light emitting device according to a second embodiment will be described with reference to FIGS. 8 and 9. In addition, the same symbols are attached to the same/corresponding portions as/to those of the first embodiment, and description thereof will be omitted.

In the present embodiment, both the anode side power supply terminal 4a and cathode side power supply terminal 4b are formed so as to extend from one side (right side in FIG. 8) of the frame member 21, and the electrical connecting unit 5 and the mechanical fixing unit 6 are combined with each other.

The electrical connecting unit 5 is a contact-pressure type power supply connector and includes the pair of contact members 52 connected to the anode side power supply terminal 4a and the cathode side power supply terminal 4b. The mechanical fixing unit 6 is a fixing member formed in an approximate U-shape and formed of elastic stainless steel. The mechanical fixing unit (fixing member) 6 and the electrical connecting unit (power supply connector) 5 are screwed together to the recess portion 71 of the mounting member 7 with screws or the like and fixed to each other.

Thus, elastic pressing force of the contact members 52 is applied to the power supply terminal 4, and the contact members 52 are electrically connected to the power supply terminal 4. Elastic pressing force of the mechanical fixing unit (fixing member) 6 is applied to three aides of the substrate 2 from above, and the substrate 2 is fixed to and held by the mounting member 7.

According to the present embodiment as described above, since the electrical connecting unit 5 and the mechanical fixing unit 6 are combined with each other, constitution and an assembling process are simplified in addition to the effect of the first embodiment.

On the other hand, the present inventors performed an experiment by preparing four kinds of light emitting devices shown in FIGS. 10(a) to (d) in advance of manufacturing the light emitting device 1 according to each, above embodiment. In addition, the same symbols are attached to the same/corresponding as/to those of the first embodiment and detailed description thereof will be omitted.

In a state of lighting each light emitting device, reliability of a contact function of the power supply connector was examined in the case where vibration is applied to the light emitting device. Specifically, a recess amount (deformation amount) of the power supply terminal 4 by the contact member 52 was measured.

Figure 10:
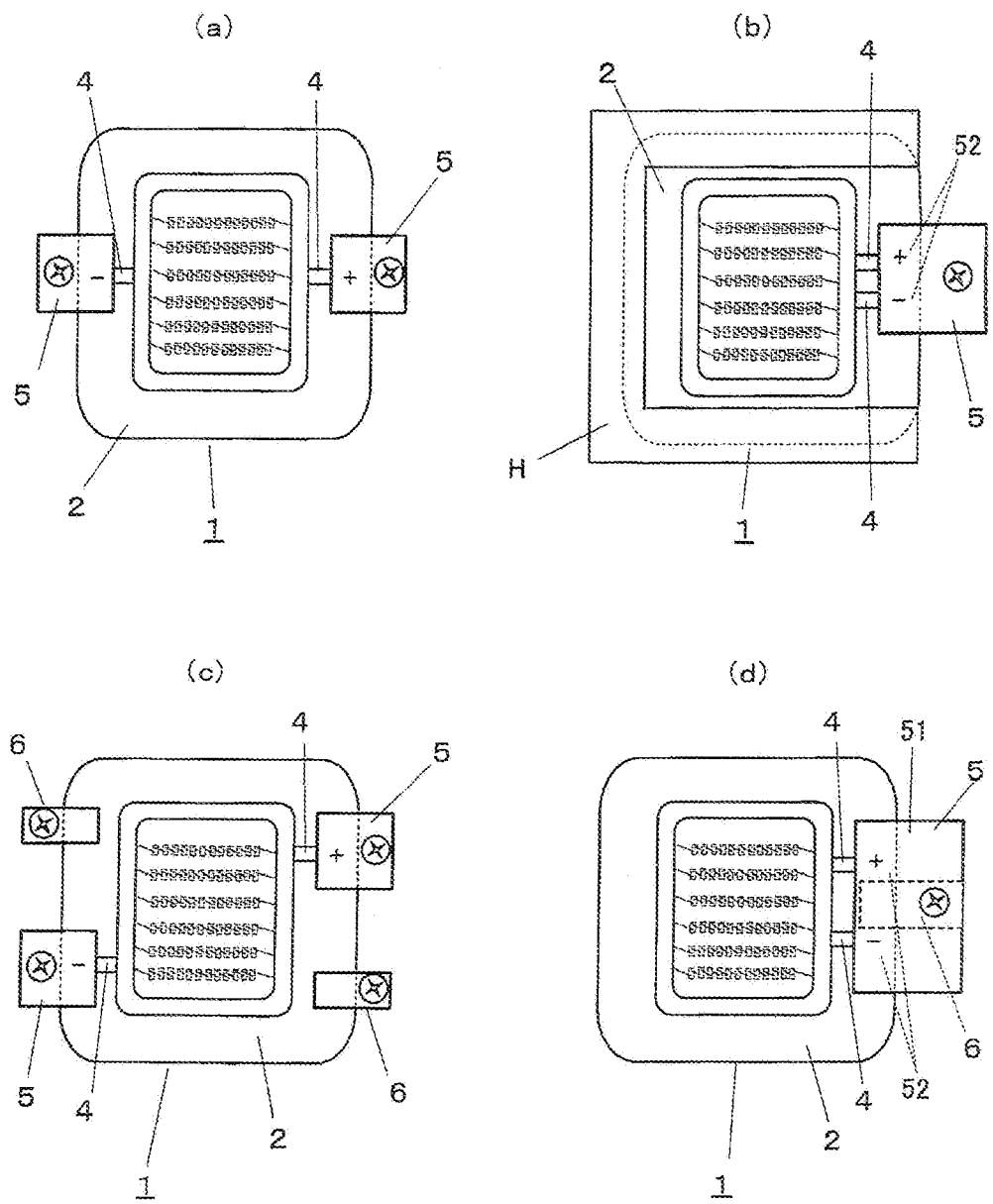
FIG. 10 is a plan view showing light emitting devices as experimental samples.

In the light emitting device (a) shown in FIG. 10(a), the electrical connecting units 5, each of which is a contact-pressure type power supply connector, are provided at both sides of the substrate 2. Accordingly, both electrical connection and mechanical fixation of the substrate 2 are performed by the electrical connecting units 5.

In the light emitting device (b) shown in FIG. 10(b), a metallic frame-shaped holder H is provided around the substrate 2 and the contact-pressure type power supply connector has the pair of positive and negative contact members 52. Accordingly, similar to the above light emitting device (a), both the electrical connection and mechanical fixation of the substrate 2 are performed by the electrical connecting unit 5.

The light emitting device (c) shown in FIG. 10(c) is constituted approximately similar to the light emitting device 1 of the first embodiment, the electrical connecting units 5 are arranged approximately on a diagonal line of the substrate 2, and the mechanical fixing units 6 are arranged approximately on the other diagonal line of the substrate 2.

In the light emitting device (d) shown in FIG. 10(d), the electrical connecting unit 5 and the mechanical fixing unit 6 are integrated, the pair of positive and negative contact members 52 is provided in the case 51 and the mechanical fixing unit 6 as a fixing member is arranged in the middle portion of the contact members 52.

FIG. 11 indicates measurement results of the recess amounts (deformation amounts) by the four kinds of light emitting devices (a) to (d). Although the deformation amounts of the light emitting devices (a) and (b) are 2 μm, those of the light emitting devices (c) and (d) are 2 μm. It was confirmed that, by providing both the electrical connecting unit 5 and mechanical fixing unit 6 in the light emitting devices (c) and (d), the deformation amount of the power supply terminal 4 can be reduced and lowering of the contact function can be suppressed.

Moreover, each light emission efficiency (%) in FIG. 11 is a relative value in the case where that of the light emitting device (a) is assumed as 100%. As a reason why the light emission efficiency of the light emitting device (b) is lowered to 97%, it is considered that the holder H becomes an obstacle and blocks light emitted from the light emitting elements 3.

Figure 12:
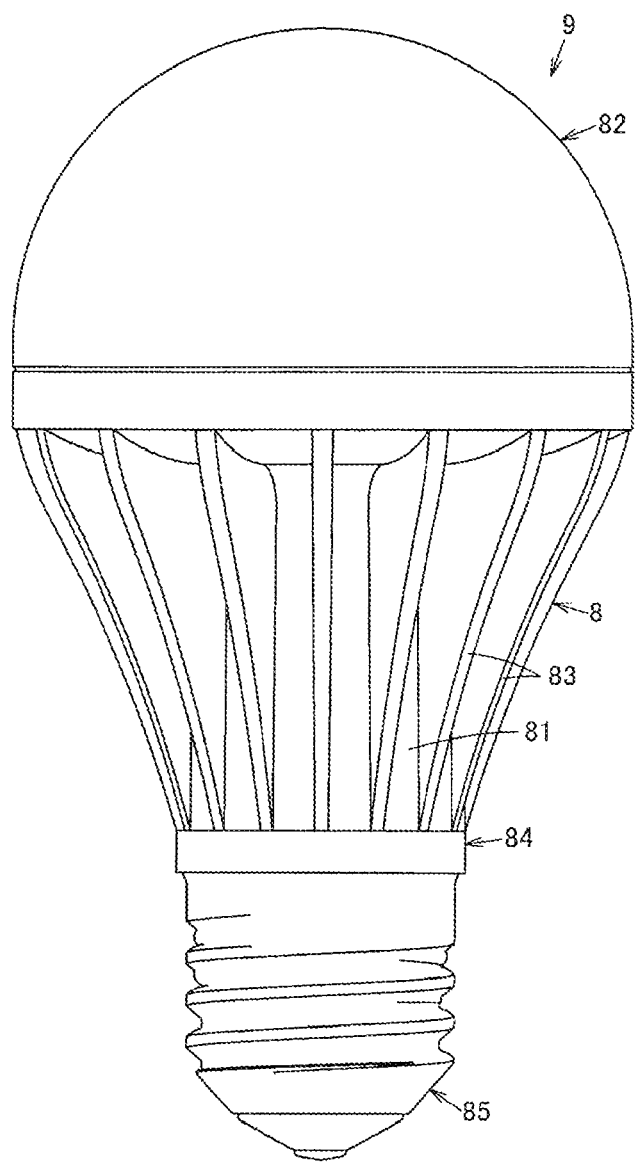
FIG. 12 is a side view showing an illumination apparatus according to the embodiments.

Next, an illumination apparatus according to the above embodiments will be described with reference to FIG. 12. The light emitting device 1 of each above embodiment can be, for example, built in an apparatus body 8 and included in an illumination apparatus 9 such as a self-ballasted lamp. In addition, in the embodiments, the apparatus body 8 has a base body 81 made of metal such as aluminum excellent in thermal conductivity, and the light emitting device 1 is attached to one end side of the base body 81 and covered with a light-transmissive glove 82. A plurality of heat radiating fins 83 are provided on a surface of the base body 81 in a lamp axis direction. Additionally, for example, an E17 type or E26 type cap 85 connectable to a socket for general illumination bulbs is attached to the other end side of the base body 81 via an insulative cover 84.

The illumination apparatus 9 can fulfill the effects of the above light emitting device 1. In addition, the apparatus body 8 is used not only for a self-ballasted LED lamp but also for, for example, a bulb road lamp, a vehicle illumination apparatus, an LED lamp as a light source, various lighting fixtures used indoors or outdoors and a display device.

In each above embodiment, as the substrate, for example, a substrate made of metal such as aluminum is usable. In this case, the power supply terminal is preferably constituted by a copper (Cu) layer as a first layer, a nickel (Ni) layer as a second layer on which the first layer is plated, and a gold (Au) layer as a third layer on which the second layer is plated.

As the light emitting element, a solid light emitting element such as an LED is usable. Further, the number of light emitting elements to be mounted is not especially limited.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light emitting device comprising:
    a substrate formed of a ceramic material which is mounted on a recessed portion provided on an upper face of a mounting member, the substrate comprising an outer edge part disposed away from an inner edge part of the recessed portion;
    a plurality of light emitting elements mounted on a surface side of the substrate;
    a power supply terminal provided on the surface side of the substrate and electrically connected to the light emitting elements;
    a plurality of electrical connecting units connected to the power supply terminal by elastic pressing force directed from the surface side of the substrate to the mounting member side; and
    a plurality of mechanical fixing units, each of which is fixed to the upper face of the mounting member, comprises a pressing portion brought into contact with the surface side of the substrate below the upper face of the mounting member, and fixes the substrate to the mounting member with use of elastic pressing force of the pressing portion directed from the surface side of the substrate to the mounting member side.

2. The light emitting device according to claim 1, wherein the elastic pressing force of the electrical connecting unit is smaller than the elastic pressing force of the mechanical fixing unit.

3. An illumination apparatus comprising:
    an apparatus body; and
    the light emitting device according to claim 2 disposed on the apparatus body.

4. The light emitting device according to claim 1, wherein at least one of the light emitting elements is an LED bare chip.

5. An illumination apparatus comprising:
    an apparatus body; and
    the light emitting device according to claim 4 disposed on the apparatus body.

6. The light emitting device according to claim 1, wherein the electrical connecting unit is a power supply connector.

7. An illumination apparatus comprising:
    an apparatus body; and
    the light emitting device according to claim 6 disposed on the apparatus body.

8. An illumination apparatus comprising:
    an apparatus body; and
    the light emitting device according to claim 1 disposed on the apparatus body.

* * * * *